United States Patent [19]
Kubota et al.

[11] Patent Number: 5,370,951
[45] Date of Patent: Dec. 6, 1994

[54] FRAME-SUPPORTED PELLICLE FOR PROTECTION OF PHOTOLITHOGRAPHIC MASK

[75] Inventors: Yoshihiro Kubota; Meguru Kashida; Yuichi Hamada; Hirofumi Kishita; Shinichi Sato; Kouichi Yamaguchi, all of Gunma, Japan

[73] Assignee: Shin-Etsu Chemical Co., Ltd., Tokyo, Japan

[21] Appl. No.: 7,525

[22] Filed: Jan. 22, 1993

[30] Foreign Application Priority Data

Jan. 31, 1992 [JP] Japan .................. 4-045988

[51] Int. Cl.$^5$ .............................. G03F 9/00
[52] U.S. Cl. ....................... 430/5; 430/321; 428/422
[58] Field of Search ............. 430/5, 321; 428/40, 428/194, 422, 412

[56] References Cited

U.S. PATENT DOCUMENTS

| | | | |
|---|---|---|---|
| 4,087,585 | 5/1978 | Schulz | 428/429 |
| 4,657,805 | 4/1987 | Fukumitsu et al. | 428/215 |
| 5,073,422 | 12/1991 | Konno et al. | 428/40 |
| 5,120,810 | 6/1992 | Fujiki et al. | 528/15 |
| 5,168,001 | 12/1992 | Legare et al. | 428/412 |

FOREIGN PATENT DOCUMENTS

| | | |
|---|---|---|
| 0252574 | 1/1988 | European Pat. Off. |
| 0315450 | 5/1989 | European Pat. Off. |
| 0527008 | 2/1993 | European Pat. Off. |

*Primary Examiner*—Steve Rosasco
*Attorney, Agent, or Firm*—McAulay Fisher Nissen Goldberg & Kiel

[57] ABSTRACT

An improvement is proposed in a frame-supported pellicle, i.e. a thin transparent film of a polymeric resin adhesively bonded to a frame member, used for dust-proof protection of a photomask in a photolithographic patterning work for the manufacture of electronic devices. The improvement comprises using, as the adhesive, an organopolysiloxane-based composition which comprises (a) a perfluoroalkyl-containing diorganopolysiloxane having at least two vinyl groups per molecule, (b) an organohydrogenpolysiloxane having at least one epoxy group and (c) a platinum catalyst for promoting the hydrosilation reaction between (a) and (b). As compared with conventional adhesives, a quite good adhesive bonding strength can be obtained with this adhesive even when the membrane is made from a fluorocarbon group-containing polymeric resin and the adhesive layer obtained therefrom is highly resistant against ultraviolet irradiation to ensure a long serviceable life of the pellicle.

18 Claims, No Drawings

FRAME-SUPPORTED PELLICLE FOR PROTECTION OF PHOTOLITHOGRAPHIC MASK

BACKGROUND OF THE INVENTION

The present invention relates to an improvement in a frame-supported pellicle for protection of a photolithographic mask or, more particularly, to an improvement in a frame-supported pellicle consisting of a frame member and a transparent thin membrane of a polymeric resin adhesively bonded to the surface of the frame member with a layer of an adhesive interposed therebetween.

As is known, various kinds of electronic devices such as LSIs, VLSIs, liquid-crystal display units and the like are manufactured by a process involving a photolithographic patterning work on a substrate such as a semiconductor silicon wafer. The photolithographic patterning is conducted by using a photomask bearing a pattern, through which the substrate surface is exposed pattern-wise to ultraviolet light. Along with the trend in recent years toward more and more increased fineness of patterns in the photolithography, it is very important that the photomask used therefor is absolutely free from dust particles deposited thereon in order to ensure accuracy and fidelity of the photolithographically reproduced pattern. In view of the fact that perfect absence of dust particles on a photomask can hardly be achieved even by working in a clean room of the highest cleanness, it is a usual practice to protect the photomask from dust particle deposition by mounting a frame-supported pellicle thereon.

A flame-supported pellicle for photolithography used in the above described purpose consists of a frame member made, usually, from aluminum, stainless steel, polyethylene and the like and a thin membrane of a polymeric material such as nitrocellulose, cellulose acetate and the like having transparency to the light used in the patterning exposure, which is flatly supported under an adequate tension on the frame by adhesively bonding with an adhesive layer therebetween. Since the pellicle membrane is held above the photomask at a certain distance and the exposure light is focused on to the pattern on the photomask, the dust particles, even when they are deposited on the pellicle membrane, cause no particular drawbacks relative to the quality of the photolithographically reproduced pattern.

Various kinds of adhesives are used for adhesively bonding a pellicle membrane to a frame member including those disclosed in U.S. Pat. No. 4,861,402 and Japanese Patent Publication No. 63-27707 such as epoxy resin-based and acrylic resin-based adhesives. Alternatively, as is taught in Japanese Patent Kokai No. 58-219032, a pellicle membrane can be adhesively bonded to a frame member by wetting the surface of the frame member with an organic solvent having good dissolving power for the polymeric material of the membrane and mounting the membrane directly on the thus wetted frame to cause adhesive bonding.

One of the problems in the above described flame-supported pellicle is that, in addition to the requirement for a high adhesive bonding strength between the membrane and the frame member as a matter of course, the adhesive bonding is sometimes not quite reliable in the lapse of time after prolonged use of the pellicle since the adhesive layer is under direct exposure to the ultraviolet light which is detrimental against the polymeric material of the adhesive to cause degradation of the adhesive resin. For example, conventional adhesives based on an epoxy resin or an acrylic resin are not quite satisfactory in this regard and, if not to mention the relatively poor adhesive bonding strength therewith, these adhesives are subject to remarkable photodegradation under irradiation with ultraviolet light so as to become brittle resulting in occurrence of dust particles from the embrittled adhesive resin per se or eventual peeling of the membrane from the frame member. In addition, the above mentioned conventional adhesives based on an epoxy or acrylic resin cannot be used for adhesively bonding a frame member and a pellicle membrane when the membrane is formed from a fluorocarbon group-containing polymer recently proposed as a material of the pellicle membrane by virtue of the very excellent performance thereof as compared with conventional cellulose derivatives because such a fluorine-containing polymer is poorly susceptible to adhesive bonding with these adhesives.

SUMMARY OF THE INVENTION

The present invention accordingly has an object to provide an improved frame-supported pellicle for dust-proof protection of a photomask used in the photolithographic patterning work in the manufacture of various kinds of electronic devices, by which the above described problems and disadvantages can mostly be overcome even when the pellicle membrane is formed from a fluorocarbon group-containing polymer.

Thus, the present invention provides an improvement, in a frame-supported pellicle used for the protection of a photolithographic photomask in the manufacture of electronic devices consisting of a frame member and a thin transparent membrane of a polymeric material supported without slack by the frame member by adhesively bonding the frame member and the polymeric membrane using an adhesive therebetween, which comprises using, as the adhesive, an organopolysiloxane-based composition comprising:

(a) a fluorocarbon group-containing diorganopolysiloxane represented by the general formula

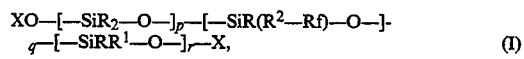

$$XO{-}[{-}SiR_2{-}O{-}]_p{-}[{-}SiR(R^2{-}Rf){-}O{-}]_q{-}[{-}SiRR^1{-}O{-}]_r{-}X, \qquad (I)$$

in which R is a monovalent hydrocarbon group free from aliphatic unsaturation, $R^1$ is an ethylenically unsaturated monovalent aliphatic hydrocarbon group, $R^2$ is a divalent hydrocarbon group free from aliphatic unsaturation or an etherified divalent hydrocarbon group free from aliphatic unsaturation having an oxygen atom between two carbon atoms forming an ether linkage, Rf is a perfluoroalkyl group or an etherified perfluoroalkyl group having at least one oxygen atom between two carbon atoms forming an ether linkage, X is a triorganosilyl group having three monovalent hydrocarbon groups bonded to the silicon atom, of which at least one is an ethylenically unsaturated monovalent aliphatic hydrocarbon group, the subscripts p and q are each a positive integer of at least 10 and the subscript r is zero or a positive integer;

(b) an organohydrogenpolysiloxane having at least two silicon-bonded hydrogen atoms and, preferably, at least one epoxy group per molecule as a crosslinking agent in such an amount that from 0.1 to 3.0 moles of the silicon-bonded hydrogen atoms are provided per mole of the ethylenically unsaturated monovalent aliphatic hydrocarbon groups in the component (a); and (c) a catalytic amount of a compound of a noble metal belonging to the VIIIth Group of the Periodic Table.

DETAILED DESCRIPTION OF THE PREFERRED EMBODIMENTS

As is described above, the improvement provided by the present invention is characterized by the use of a specific adhesive composition based on a fluorocarbon group-containing diorganopolysiloxane represented by the above given general formula (I) for adhesively bonding a pellicle membrane of a polymeric resin to a frame member to give a frame-supported pellicle. The essential ingredients in the adhesive composition include the above defined fluorocarbon-group-containing diorganopolysiloxane having ethylenically unsaturated hydrocarbon groups as the component (a), an epoxy group-containing organohydrogenpolysiloxane as the component (b) and a noble metal compound as the component (c) to serve as a catalyst for promoting the addition reaction between the ethylenically unsaturated hydrocarbon groups in the component (a) and the silicon-bonded hydrogen atoms in the component (b).

The diorganopolysiloxane as the component (a) of the adhesive composition is represented by the above given general formula (I). In this general formula, the symbol R denotes a monovalent hydrocarbon group free from aliphatic unsaturation having, preferably, 1 to 8 carbon atoms. Examples of the monovalent hydrocarbon group suitable as R include alkyl groups such as methyl, ethyl, propyl and butyl groups, cycloalkyl groups such as cyclohexyl and cyclopentyl groups, aryl groups such as phenyl, tolyl and xylyl groups and aralkyl groups such as benzyl and 2-phenylethyl groups. A part or all of the hydrogen atoms in these hydrocarbon groups can be replaced with substituent groups such as halogen, e.g., chlorine, atoms, cyano groups and the like to give, for example, chloromethyl and 2-cyanoethyl groups. Preferably, the group R is a methyl group.

The group denoted by $R^1$ in the general formula (I) is an ethylenically unsaturated group such as vinyl and allyl groups, of which vinyl is preferred.

The group denoted by $R^2$ in the general formula (I) is a linking group between a silicon atom in the polysiloxane chain and the perfluorinated group denoted by Rf. Namely, the group $R^2$ is a divalent hydrocarbon group free from aliphatic unsaturation having, for example, 1 to 8 carbon atoms. The group $R^2$ can be an etherified divalent hydrocarbon group having an oxygen atom between two carbon atoms forming an ether linkage. Accordingly, the group $R^2$ is exemplified by those expressed by the following structural formulas, in which Me is a methyl group and Pn is a phenylene group:

$-CH_2-$; $-CH_2CH_2-$; $-CH_2CH_2CH_2-$;
$-CH_2CH_2CH_2CH_2CH_2CH_2-$; $-[-CHMe-CH_2-]_2-$; $-Pn-$;
$-CH_2-O-CH_2-$; $-CH_2CH_2CH_2-O-CH_2-$;
$-CH_2-O-CH_2CH_2CH_2-$; and $-CH_2-O-CH_2-Pn-$, of which particularly preferable are: $-CH_2CH_2-$; $-CH_2CH_2CH_2-$; and $-CH_2CH_2CH_2-O-CH_2-$. When the group is unsymmetrical as in $-CH_2CH_2CH_2-O-CH_2-$, it should be construed that the carbon atom at the lefthand end of the formula is bonded to the silicon atom and the carbon atom at the righthand end of the formula is bonded to the Rf group.

The group Rf in the general formula (I) is a perfluoroalkyl group, which optionally is etherified by having one or more oxygen atoms each between two carbon atoms forming an ether linkage, having 4 to 16 or, preferably, 4 to 10 carbon atoms. When Rf is a perfluoroalkyl group, examples of suitable groups include perfluorohexyl, perfluorooctyl and pefluorodecyl groups while, when it is an etherified perfluoroalkyl group, suitable groups are those expressed by the following formulas:

$C_3F_7-O-CF(CF_3)-$; $C_3F_7-O-CF(CF_3)-CF_2-O-CF(CF_3)-$;
$C_2F_5-O-CF_2-CF_2-$; and $C_3F_7-O-CF(CF_3)-CF_2-O-CF_2-$, though not particularly limitative thereto.

The group denoted by X at each molecular chain end of the diorganopolysiloxane molecule is a triorganosilyl group having three monovalent hydrocarbon groups bonded to the same silicon atom at the polysiloxane chain end. It is essential that at least one of the three monovalent hydrocarbon groups is an ethylenically unsaturated group such as vinyl, allyl and hexenyl groups, of which vinyl is preferred. The others of the three monovalent hydrocarbon groups can be either saturated or unsaturated. An example of the preferable groups as X is a vinyl dimethyl silyl group.

The subscript p in the general formula (I) is a positive integer of at least 10 or, preferably, in the range from 100 to 10,000 and the subscript q in the general formula (I) is a positive integer of at least 10 or, preferably, in the range from 50 to 5,000. The subscript r is zero or a positive integer but it is preferable that the ratio of q:(p+q+r) is in the range from 1:50 to 1:3. The values of these subscripts are determinant of the degree of polymerization of the diorganopolysiloxane molecules or, in turn, the viscosity of the diorganopolysiloxane. In this regard, these subscripts each should preferably have such a value that the diorganopolysiloxane may have a viscosity in the range from 100 to 10,000,000 centistokes at 25° C. It is of course optional that the component (a) is a combination of two kinds or more of different diorganopolysiloxanes each satisfying the above given definition.

The above described fluorocarbon group-containing diorganopolysiloxane can be synthesized by a method which is readily understood by those skilled in the art of silicone products. For example, a ring-opening polymerization reaction is effected in a mixture of cyclic trimers or tetramers consisting of the diorganosiloxane units of the formulas $[-SiR(R^2-Rf)O], [-SiR_2O]$ and, optionally, $[-SiRR^1O]$ together with a hexaorganodisiloxane of the formula X—O—X as a terminal group-supplying ingredient, in which each symbol has the same meaning as defined before, in the presence of an alkali or acid catalyst. Suitable alkali or acid catalysts include alkali hydroxides such as lithium hydroxide, sodium hydroxide and potassium hydroxide, alkali siliconates such as lithium siliconate, sodium siliconate and potassium siliconate, quaternary ammonium or phosphonium hydroxides such as tetramethyl ammonium hydroxide and tetrabutyl phosphine hydroxide, pentacovalent silicon compounds, sulfuric acid, trifluoromethane sulfonic acid and so on. In particular, an alkali siliconate of the general formula $X-O-(-SiR_2-O-)_n-M$, in which M is an atom of an alkali metal and n is zero or a positive integer, serves in two ways as an alkali catalyst and as a terminal group-supplying ingredient.

The component (b) in the adhesive composition used in the invention is an organohydrogenpolysiloxane having, in a molecule, at least two hydrogen atoms directly bonded to the silicon atoms and, preferably, at least one epoxy group. This component serves as a crosslinking agent of the above described component (a) by pertaining to the addition reaction or so-called hydrosilation reaction between the ethylenically unsaturated hydrocarbon groups or vinyl groups in the component (a) and the silicon-bonded hydrogen atoms in this component. The component also serves as an adhesion aid since epoxy groups are contained therein. It is of course optional that the component (b) is a combination of two organohydrogenpolysiloxanes having and free from epoxy groups.

The epoxy-containing organohydrogenpolysiloxane as the component (b) is typically represented by the general formula:

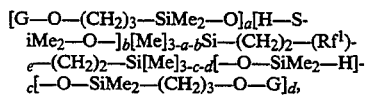

in which G is a glycidyl group, Me is a methyl group, $Rf^1$ is a perfluorinated divalent alkylene group or etherified alkylene group having an oxygen atom between two carbon atoms, the subscripts a, b, c and d are each zero or a positive integer with the proviso that a+b and c+d are each 1, 2 or 3, a+d is at least 1 and b+c is at least 2 and the subscript e is zero or 1. Particular examples of the epoxy-containing organohydrogenpolysiloxane include those expressed by the following formulas:

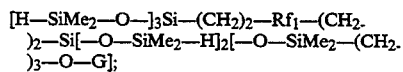

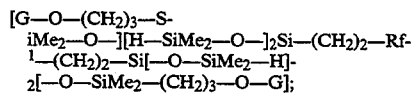

and

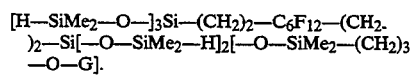

The amount of the component (b) in the adhesive composition should be sufficient to provide from 0.1 to 3.0 moles or, preferably, from 0.2 to 2.0 moles of the silicon-bonded hydrogen atoms per mole of the ethylenically unsaturated hydrocarbon groups or, in particular, vinyl groups in the component (a). When the amount of the component (b) is too small, the adhesive bonding strength exhibited by the adhesive composition after curing cannot be high enough due to the deficiency in the crosslinking density and lack of the adhesion-promoting effect by the epoxy groups. When the amount of the component (b) is too large, on the other hand, a trouble of foaming is sometimes caused due to the excessively large number of the silicon-bonded hydrogen atoms. In a rough calculation, the amount of the component (b) is in the range from 0.1 to 50 parts by weight per 100 parts by weight of the component (a).

It is optional or sometimes advantageous that the component (b) is a combination of the above described epoxy group-containing organohydrogenpolysiloxane and an organohydrogenpolysiloxane having no epoxy groups which also can be a crosslinking agent for the component (a). Such an epoxy-free organohydrogenpolysiloxane is a well known compound as an ingredient in a addition reaction-curable organopolysiloxane composition. In particular, an organohydrogenpolysiloxane having at least one fluorine-substituted hydrocarbon group, e.g., a group expressed by the formula $—R^2—Rf$, as a part of the monovalent hydrocarbon groups bonded to the silicon atoms is preferred. Examples of such an organohydrogenpolysiloxane include those indicated by the following:

$Me_3Si—O—[—SiMe_2—O—]_u—[—SiMe(R^2—Rf)—O—]_v—[—SiMeH—O—]_w—SiMe_3$, in which the subscripts u and v are each zero or a positive integer and the subscript w is a positive integer of 2 or larger;

cyclic oligomers, e.g., trimers and tetramers, consisting of the difunctional siloxane units of the formulas $[—SiMe_2O]$, $[—SiMe(R^2—Rf)O]$ and $[—SiMeHO]$ including at least two of the units $[—SiMeHO]$;

$Rf—R^2—Si[—O—SiMe_2H]_3$; and $Si[—O—SiMe_2H]_4$.

In addition, usable organohydrogenpolysiloxanes include those consisting of the monofunctional siloxane units of the formula $[SiMe_2H—O_{0.5}]$ and the tetrafunctional siloxane units of the formula $[SiO_2]$. The epoxy-free organohydrogenpolysiloxane should preferably have a viscosity not exceeding 1000 centistokes at 25° C.

The component (c) in the adhesive composition, which serves to catalytically accelerate the addition reaction or so-called hydrosilation reaction to form crosslinks between the ethylenically unsaturated hydrocarbon groups or vinyl groups in the component (a) and the silicon-bonded hydrogen atoms in the organohydrogenpolysiloxane as the component (b), is a compound of a noble metal belonging to the VIIIth Group of the Periodic Table, such as platinum, palladium and rhodium. Platinum compounds are preferred in respect of good availability. Suitable platinum compounds include chloroplatinic acid, complexes of chloroplatinic acid with an olefin such as ethylene, complexes of chloroplatinic acid with an alcohol and complexes of chloroplatinic acid with a vinyl-containing organopolysiloxane. They are used preferably in the form of a solution in an organic solvent.

The amount of the curing catalyst as the component (c) naturally depends on the desired curing velocity. The amount is usually in the range from 1 to 1000 ppm by weight or, preferably, from 10 to 500 ppm by weight calculated as metal, e.g., platinum, based on the overall amount of the adhesive composition, which accordingly can be fully cured within a few minutes to several hours at a temperature of 100° to 200° C.

The adhesive composition used in the present invention can be prepared by uniformly blending the above described essential and optional components each in a specified amount. It is of course optional that the adhesive composition is further admixed with various kinds of known additives according to need. For example, the bonding strength of the adhesive composition can be increased by the addition of an organopolysiloxane having a resinous structure as consisting of the tetrafunctional siloxane units of the formula $[SiO_2]$ and monofunctional siloxane units of the formulas

[(CH$_2$=CH)R$_2$SiO$_{0.5}$] and [R$_3$SiO$_{0.5}$], R having the same meaning as defined before. The curing velocity of the adhesive composition can be moderated or controlled by the addition of an organopolysiloxane having the difunctional siloxane units of the formula [CH$_2$=CH)RSiO], an organic compound having an acetylenic triple bond and an ionic compound of a heavy metal. Further, the adhesive layer after curing can be imparted with increased flexibility by the admixture thereof with an organopolysiloxane having no functionality. It is of course optional that the adhesive composition is admixed with an inorganic filler with an object to decrease shrinkage of the composition by curing as well as the thermal expansion coefficient of the cured adhesive composition and to improve the thermal stability, weatherability and mechanical strength of the cured adhesive composition. Examples of suitable fillers include fumed and precipitated silica fillers, finely divided quartz powder, glass fibers, powdery or fibrous carbon, metal oxides, e.g., iron oxide, titanium dioxide and ceric oxide, and metal carbonates, e.g., calcium carbonate and magnesium carbonate. Coloring agents, e.g., dyes and pigments, and antioxidants are also among the known additives which can be added to the adhesive composition according to need.

If desired, a small volume of an organic solvent, such as toluene and xylene, can be added to the adhesive composition so as to impart the composition with a viscosity suitable for the coating work of the frame member or the membrane therewith.

The polymeric material of the pellicle membrane, which is adhesively bonded to a frame member by using the above described adhesive composition according to the invention, is not particularly limitative. For example, most conventional cellulose derivatives such as nitrocellulose and cellulose acetate can of course be used although these cellulose derivatives are defective in respect of the poor stability against ultraviolet irradiation to cause yellowing or degradation during use as a consequence of their strong absorption of ultraviolet light in a short wavelength region of 210 to 500 nm. These cellulose derivatives are therefore not recommendable as a material of the pellicle membrane for use in a very fine patterning work of VLSIs and very finely patterned liquid-crystal display units which is performed usually by using a short-wave-length ultraviolet light such as excimer laser beams and so-called g- and i-lines.

When the frame-supported pellicle according to the invention is used in a photolithographic patterning work using short-wave-length ultraviolet light, accordingly, the polymeric material of the pellicle membrane is preferably limited, for example, to a polymer of trimethyl vinyl silane disclosed in Japanese Patent Kokai 2-230245 and pullulan compound disclosed in Japanese Patent Kokai 3-210561 as well as an amorphous fluorocarbon polymer and silicone-modified polyvinyl alcohol recently proposed by some of the inventors and so on.

These polymers can be shaped into a membrane by any known method such as casting of a solution. For example, the polymer is dissolved in a suitable organic solvent in a concentration of 3 to 10% by weight and the solution is cast on to the surface of a flat and horizontally held substrate plate followed by evaporation of the solvent and peeling of the dried film from the substrate surface. The thus prepared membrane for pellicle should have a thickness in the range from 0.1 to 10 μm or, preferably, from 0.5 to 5 μm in consideration of the balance between the mechanical strength and the transmissivity of light.

For example, the pellicle membrane should have a transmissivity of light of at least 95% or, desirably, at least 98% in the wavelength region of 210 to 500 nm for the purpose of practical applications although a transmissivity of as low as 90% may be sometimes acceptable when a relatively large thickness of 5 μm or larger is required for some reasons relative to the mechanical strength.

It is advantageous that, in order to minimize deposition of dust particles on the pellicle membrane from outside by the attractive force of any accumulated electrostatic charge, the pellicle membrane is subjected to an antistatic treatment by forming a transparent electroconductive layer thereon or by rendering the surface hydrophilic by a chemical or physical treatment. It is also advantageous that the pellicle membrane is provided on the surface with a low-reflectance coating film of magnesium fluoride, calcium fluoride and the like in order to increase the effective transmissivity of light therethrough. Further, it is optional that the pellicle membrane is coated with an adhesive sticking agent on the surface facing the photomask when the flame-supported pellicle is mounted on a photomask with an object to capture any dust particles floating in the space between the pellicle membrane and the photomask. The above described additional treatments of a pellicle membrane can be undertaken either before or after adhesive bonding of the membrane to the surface of a frame member.

The frame-supported pellicle according to the invention is prepared by adhesively bonding the pellicle membrane, flatly and under an adequate tension, to the surface of a frame member by using the above described specific adhesive composition. As a commercial product, the thus prepared flame-supported pellicle is coated with an adhesive sticking agent on the surface of the frame member opposite to the surface to which the pellicle membrane is adhesively bonded in order to facilitate mounting of the frame-supported pellicle on to a photomask and the sticky surface is protected by attaching a release paper sheet for temporary protection.

In the following, the frame-supported pellicle as improved according to the invention is illustrated in more detail by way of examples and comparative examples.

EXAMPLE 1

A pellicle membrane having a thickness of 1.21 μm was prepared by the casting method from a solution of a perfluorinated polymer (Teflon AF 1600, a product by Du Pont Co.), which is a copolymer of tetrafluoroethylene and a cyclic perfluoroether compound, dissolved in a fluorocarbon solvent (Florinert FC-75, a product by 3M Co.). The solution was cast on a well polished fused quartz glass disc having a diameter of 200 mm and a thickness of 3 mm followed by drying at 150° C. for 3 hours and peeling of the thus dried film from the substrate surface in water to be transferred on to a Teflon-made annular frame having an outer diameter of 150 mm and dried thereon in a vacuum drying oven at 100° C. for 5 hours.

Separately, a fluorocarbon-containing organopolysiloxane as an adhesive composition, referred to as the adhesive I hereinbelow, was prepared in the following manner.

Into a four-necked flask equipped with a stirrer, gas-inlet tube, thermometer and gas-exhaust tube, firstly, were introduced 1000 g of a perfluoroalkyl group-containing cyclic organopolysiloxane trimer 1,1,3,3,5-pentamethyl-5-(2-perfluorooctyl)ethyl cyclotrisiloxane, 2.1 g of 1,1,3,3-tetramethyl-1,3-divinyl disiloxane and 0.1 g of trifluoromethane sulfonic acid and the mixture was agitated at 50° C. for 6 hours to effect the ring-opening polymerization of the cyclic trimer to give a polymer terminated at each molecular chain end with a dimethyl vinyl siloxy group. After completion of the reaction, the reaction mixture was neutralized by the addition of 0.4 g of a 30% ammonia water followed by an adsorption treatment with active carbon and removal of volatile matters by distillation. The thus obtained diorganopolysiloxane, referred to as the polysiloxane A hereinbelow, could be expressed by the average formula

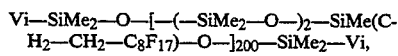
Vi—SiMe$_2$—O—[—(—SiMe$_2$—O—)$_2$—SiMe(C-H$_2$—CH$_2$—C$_8$F$_{17}$)—O—]$_{200}$—SiMe$_2$—Vi, in which Me is a methyl group and Vi is a vinyl group.

A 100 g portion of the polysiloxane A was admixed with 15 g of a fumed silica filler surface-blocked with trimethylsiloxy groups and the blend was kneaded in a kneader at 150° C. for 2 hours followed by milling on a three-roller mill. In the next place, this blend was further admixed with 1.8 g of an epoxy-containing organohydrogenpolysiloxane, referred to as the polysiloxane B hereinbelow, expressed by the formula

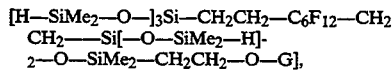
[H—SiMe$_2$—O—]$_3$Si—CH$_2$CH$_2$—C$_6$F$_{12}$—CH$_2$CH$_2$——Si[—O—SiMe$_2$—H]$_2$—O—SiMe$_2$—CH$_2$CH$_2$—O—G], in which Me is a methyl group and G is a glycidyl group, 1.8 g of another organohydrogenpolysiloxane free from epoxy groups, referred to as the polysiloxane C hereinbelow, as expressed by the formula

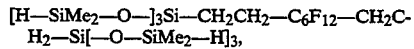
[H—SiMe$_2$—O—]$_3$Si—CH$_2$CH$_2$—C$_6$F$_{12}$—CH$_2$C-H$_2$—Si[—O—SiMe$_2$—H]$_3$, 0.47 g of carbon black, 0.1 g of a toluene solution of a complex of chloroplatinic acid with 1,1,3,3-tetramethyl-1,3-divinyl disiloxane in a concentration of 1.0% by weight as platinum and 0.2 g of 2-ethynyl propan-2-ol.

The above prepared adhesive I was applied to the surface of the first prepared membrane on a Teflon frame in a coating thickness of about 100 µm and a hoop-like aluminum frame member having an inner diameter of 130 mm, outer diameter of 140 mm and height of 6 mm was mounted thereon and adhesively bonded thereto by heating at 120° C. for 2 hours to give a frame-supported pellicle having the membrane flatly supported on the frame member in a crease-free fashion. The light transmissivity of this pellicle membrane was 98.7% for the ultraviolet light having a wave-length of 365 nm.

The adhesive bonding strength between the pellicle membrane and the aluminum frame was tested in the following manner. Thus, the frame-supported pellicle was held horizontally with the membrane facing downwardly and water was put on the area of the membrane surrounded by the aluminum frame drop by drop to make a pool of water and the amount of the water on the membrane was recorded when peeling took place between the frame and the membrane. The result was 118 g.

With an object to test the stability of the adhesive bonding against ultraviolet irradiation, the frame-supported pellicle was irradiated with an excimer laser beam having a wavelength of 248 nm in an intensity of 200 watts/cm$^2$ for a period of 1000 hours and the changes in the appearance and the adhesive bonding strength between the frame and the membrane were examined. The results were that absolutely no changes were noted in the appearance of the membrane per se and the adhesive layer and the adhesive bonding strength also unchanged as compared with that before the irradiation test.

EXAMPLE 2

The experimental procedure was just the same as in Example 1. The adhesive composition, referred to as the adhesive II hereinbelow, used in the experiment was prepared also in the same manner as the adhesive I excepting omission of 1.8 g of the epoxy-containing organohydrogenpolysiloxane, i.e. the polysiloxane B.

The results of the testing undertaken with this frame-supported pellicle were that the adhesive bonding strengths between the frame member and the pellicle membrane were 109 g and 75 g before and after the laser beam irradiation test and no changes were noted in the appearance of the pellicle membrane per se and the adhesive layer.

Comparative Example

The experimental procedure was substantially the same as in the above described Examples 1 and 2 except that the adhesive I or II was replaced with a conventional epoxy resin-based adhesive (Araldite Rapid, a product by Showa Polymer Co.). The adhesive bonding strength between the frame member and the pellicle membrane as prepared was only 2.6 g already showing partial peeling of the membrane and substantially no adhesive bonding strength was retained after the laser beam irradiation test, which caused remarkable embrittlement and blackening in the adhesive layer.

EXAMPLE 3

A pellicle membrane having a thickness of 1.32 µm was prepared in substantially the same manner as in Example 1 except that the perfluorinated polymeric resin was, instead of Teflon AF 1600, Saitop (a product by Asahi Glass Co.) consisting of the moieties derived from tetrafluoroethylene and a perfluorinated cyclic ether compound.

Separately, a perfluorocarbon-containing vinyl-terminated diorganopolysiloxane, referred to as the polysiloxane D hereinbelow, was prepared in substantially the same manner as in Example 1 excepting replacement of 1,1,3,3,5-pentamethyl-5-(2-perfluorooctyl)ethyl cyclotrisiloxane with the same amount of another cyclic trisiloxane having, in place of the perfluorooctyl group, a perfluorinated ether group expressed by the formula

—CF(CF$_3$)—[—O—CF$_2$—CF(CF$_3$)—]$_2$—F.

The polysiloxane D thus prepared can be expressed by the same formula as the polysiloxane A in which the perfluorooctyl group is replaced with the perfluorinated ether group shown above.

An adhesive composition, referred to as the adhesive III hereinbelow, was prepared in the same formulation and in the same manner as in the adhesive I excepting replacement of the polysiloxane A with the same amount of the polysiloxane D.

The film of the Saitop resin was adhesively bonded to an aluminum frame in the same manner as in Example 1 by using the adhesive III prepared above to give a frame-supported pellicle. The light transmissivity of this pellicle membrane was 97.2% for the ultraviolet light having a wavelength of 248 nm. This frame-supported pellicle was subjected to the evaluation test in the same manner as in Example 1. The results of the test were that absolutely no changes were noted in the appearance of the membrane per se and the adhesive layer by the laser beam irradiation test and the adhesive bonding strengths were 133 g and 134 g before and after, respectively, the laser beam irradiation.

What is claimed is:

1. In a frame-supported pellicle used for the protection of a photolithographic photomask in the manufacture of electronic devices consisting of a frame member and a thin transparent membrane of a polymeric material supported without slack by the frame member by adhesively bonding the frame member and the polymeric membrane using an adhesive composition therebetween, the improvement which comprises using, as the adhesive composition, an organopolysiloxane-based composition comprising:

(a) a fluorocarbon group-containing diorganopolysiloxane represented by the general formula

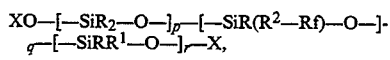
    XO—[—SiR$_2$—O—]$_p$—[—SiR(R$^2$—Rf)—O—]-
    $_q$—[—SiRR$^1$—O—]$_r$—X, in which R is a monovalent hydrocarbon group free from aliphatic unsaturation, R$^1$ is an ethylenically unsaturated monovalent aliphatic hydrocarbon group, R$^2$ is a divalent hydrocarbon group free from aliphatic unsaturation or an etherified divalent hydrocarbon group free from aliphatic unsaturation having an oxygen atom between two carbon atoms forming an ether linkage, Rf is a perfluoroalkyl group or an etherified perfluoroalkyl group having at least one oxygen atom between two carbon atoms forming an ether linkage, X is a triorganosilyl group having three monovalent hydrocarbon groups bonded to the silicon atom, of which at least one is an ethylenically unsaturated monovalent aliphatic hydrocarbon group, the subscripts p and q are each a positive integer of at least 10 and the subscript r is zero or a positive integer;

(b) an organohydrogenpolysiloxane having at least two silicon-bonded hydrogen atoms per molecule as a crosslinking agent in such an amount that from 0.1 to 3.0 moles of the silicon-bonded hydrogen atoms are provided per mole of the ethylenically unsaturated monovalent aliphatic hydrocarbon groups in the component (a); and (c) a catalytic amount of a compound of a noble metal belonging to the VIIIth Group of the Periodic Table.

2. The improvement as claimed in claim 1 in which the monovalent hydrocarbon group free from aliphatic unsaturation denoted by R has from 1 to 8 carbon atoms.

3. The improvement as claimed in claim 1 in which the monovalent hydrocarbon group free from aliphatic unsaturation denoted by R is selected from the class consisting of alkyl groups, cycloalkyl groups, aryl groups and aralkyl groups.

4. The improvement as claimed in claim 3 in which the monovalent hydrocarbon group free from aliphatic unsaturation denoted by R is a methyl group.

5. The improvement as claimed in claim 1 in which the ethylenically unsaturated monovalent aliphatic hydrocarbon group denoted by R$^1$ is a vinyl group.

6. The improvement as claimed in claim 1 in which the divalent hydrocarbon group free from aliphatic unsaturation or an etherified divalent hydrocarbon group free from aliphatic unsaturation denoted by R$^2$ is selected from the class consisting of the groups expressed by the formulas:

—CH$_2$—; —CH$_2$CH$_2$—; —CH$_2$CH$_2$CH$_2$—; —CH$_2$CH$_2$CH$_2$CH$_2$CH$_2$CH$_2$—; —[—CH-Me—CH$_2$—]$_2$—; —Pn—; —CH$_2$—O—CH$_2$—; —CH$_2$CH$_2$CH$_2$—O—CH$_2$—; —CH$_2$—O—CH$_2$CH$_2$CH$_2$—; and —CH$_2$—O—CH$_2$—Pn—,

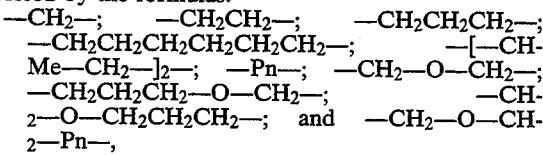

in which Me is a methyl group and Pn is a phenylene group.

7. The improvement as claimed in claim 1 in which the perfluoroalkyl group or an etherified perfluoroalkyl group denoted by Rf is selected from the class consisting of the groups expressed by the formulas:

C$_3$F$_7$—O—CF(CF$_3$)—; C$_3$F$_7$—O—CF(CF$_3$)—CF$_2$—O—CF(CF$_3$)—; C$_2$F$_5$—O—CF$_2$CF$_2$—; and C$_3$F$_7$—O—CF(CF$_3$)—CF$_2$—O—CF$_2$—.

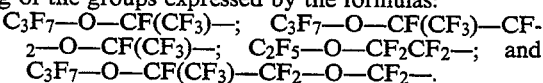

8. The improvement as claimed in claim 1 in which the group denoted by X is a vinyl dimethyl silyl group.

9. The improvement as claimed in claim 1 in which the subscript p is a positive integer in the range from 100 to 10,000.

10. The improvement as claimed in claim 1 in which the subscript q is a positive integer in the range from 50 to 5,000.

11. The improvement as claimed in claim 1 in which the subscripts p, q and r satisfy the relationship that the ratio of q:(p+q+r) is in the range from 1:50 to 1:3.

12. The improvement as claimed in claim 1 in which the component (b) has at least one epoxy group per molecule.

13. The improvement as claimed in claim 12 in which the component (b) is represented by the general formula

[G—O—(CH$_2$)$_3$—SiMe$_2$—O]$_a$[H—SiMe$_2$—O—]$_b$[Me]$_{3-a-b}$Si—(CH$_2$)$_2$—(Rf$^1$)$_e$—(CH$_2$)$_2$—Si[Me]$_{3-c-d}$[—O—SiMe$_2$—H]$_c$[—O—SiMe$_2$—(CH$_2$)$_3$—O—G]$_d$,

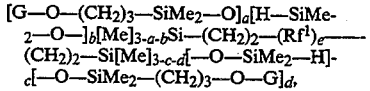

in which G is a glycidyl group, Me is a methyl group, Rf$^1$ is a perfluorinated alkylene group or etherified alkylene group having an oxygen atom between two carbon atoms, the subscripts a, b, c and d are each zero or a positive integer with the proviso that a+b and c+d are each 1, 2 or 3, a+d is at least 1 and b+c is at least 2 and the subscript e is zero or 1.

14. The improvement as claimed in claim 1 in which the amount of the component (b) is sufficient to provide from 0.2 to 2.0 moles of the silicon-bonded hydrogen atoms per mole of the ethylenically unsaturated hydrocarbon groups in the component (a).

15. The improvement as claimed in claim 1 in which the noble metal belonging to the VIIIth Group of the Periodic Table is platinum.

16. The improvement as claimed in claim 1 in which the amount of the compound of a noble metal is in the range from 1 to 1000 ppm by weight calculated as the metal based on the overall amount of the adhesive composition.

17. The pellicle of claim 1 wherein the number of carbon atoms in the group Rf is from 4 to 16.

18. The pellicle of claim 17 wherein Rf group has from 4 to 10 carbon atoms.

* * * * *